United States Patent [19]

Makins

[11] 3,861,775

[45] Jan. 21, 1975

[54] MULTIPLE CIRCUIT BOARD CONNECTOR

[75] Inventor: James L. Makins, Palmyra, N.Y.

[73] Assignee: Xerox Corporation, Stamford, Conn.

[22] Filed: Nov. 3, 1972

[21] Appl. No.: 303,458

[52] U.S. Cl. ..... 339/17 L, 339/176 MP, 339/206 R
[51] Int. Cl. .......... H05k 1/07
[58] Field of Search .......... 339/17 F, 17 L, 17 LC, 339/17 LM, 176 MP, 176 MF, 75 MP, 206

[56] References Cited

UNITED STATES PATENTS

| | | | |
|---|---|---|---|
| 3,277,425 | 10/1966 | Marshall et al. | 339/176 MF |
| 3,660,803 | 5/1972 | Cooney | 339/176 MP |

OTHER PUBLICATIONS

"DeJur Electronic Components," Aug., 1958, page 125.

"H. H. Buggie, Inc.," 1954, page 3.

*Primary Examiner*—Roy D. Frazier
*Assistant Examiner*—Lawrence J. Staab
*Attorney, Agent, or Firm*—James J. Ralabate; William A. Henry; Henry Fleischer

[57] ABSTRACT

An electrical connector in which a multiple circuit board is mounted therein for interconnection with a plurality of external lead wires.

The foregoing abstract is neither intended to define the invention disclosed in the specification nor is it intended to be limiting as to the scope of the invention in any way.

7 Claims, 6 Drawing Figures

MULTIPLE CIRCUIT BOARD CONNECTOR

BACKGROUND OF THE INVENTION

This invention relates generally to an electrical connector for a multiple circuit board, and more particularly concerns a connector which slidably receives the edge of the multiple circuit board.

In interconnecting electronic components with electrical lead wires it is desirable to utilize a multiple circuit board, commonly referred to in the art as a printed circuit board. The printed circuit board is used as a base for the various types of electrical components required for the system. These electrical components are interconnected to one another, and the external electrical lead wires by the printed circuit board. Typical boards have both sides thereof coated with a thin metal sheet, e.g., a thin sheet of copper. A chemical etching process removes the copper in all areas except strips left thereon in order to form the requisite electrical connections. The strips remaining on the board replace electrical wires formerly utilized to interconnect the electrical components with one another and the external lead wires in the appropriate circuit configuration. In order to connect the electrical lead wires with the board, each strip extends to a row of uniformly spaced edge contacts arranged to engage external lead wires.

Heretofore, various types of electrical connectors were utilized to achieve the foregoing results. For example, U.S. Pat. No. 3,172,718 issued to Lalonde in 1965 describes an electrical connector adapted to have the ends of the external lead wires wrapped around the shank of individual connectors. Other types of electrical connectors for interconnecting the lead wires with the contacts on the edge of the printed circuit board are individual contact clips having each lead wire secured thereto. In this type of arrangement, each clip is clamped to the edge contact of the circuit board. Similarly, some connectors utilize a plurality of contact clips corresponding in number and spacing to the contacts on the multiple circuit board. A supporting member secures the clips in a row. The edge of the board may be inserted into the row of contact clips to make the desired plurality of connections between the clips and the contacts on the edge of the board. These connectors and others are exemplified by U.S. Pat. No. 2,911,609 issued to Burtt et al. in 1959, U.S. Pat. No. 3,131,017 issued to Mittler in 1964 and U.S. Pat. No. 3,518,620 issued to Bushery et al. However, the above noted prior art patents do not disclose any provisions for meeting international standards, nor are the external lead wires readily secured to the electrical connectors with commercially available terminals. In addition thereto, no provisions are made therein to insure that the Underwriters Laboratory standards are met while minimizing the cost requirements thereof.

Accordingly, it is the primary object of the present invention to improve electrical connectors used for multiple circuit boards.

SUMMARY OF THE INVENTION

Briefly stated and in accordance with the present invention, there is provided an electrical connector for interconnecting a multiple circuit board with a plurality of external lead wires.

In the preferred embodiment thereof, the electrical connector includes a first elongated dielectric block, a second elongated dielectric block affixed to the first block, and a plurality of resilient electrical contacts. The first elongated dielectric block has a pair of opposed rows of compartments defining a groove therebetween extending substantially along the longitudinal axis thereof from one end wall and terminating at the other end wall spaced therefrom. In the preferred construction, the second block has at least a pair of rows of apertures therein. The apertures in the second block are aligned with corresponding compartments in the first block. Each of the plurality of resilient electrical contacts have a shank portion extending into each of the apertures in the second block. In addition thereto, a leaf spring portion having an arcuate region and a straight region is arranged such that the arcuate region extends into the groove in the first block whereas the straight region thereof extends into one of the compartments in the first block. In this manner, the multiple circuit board may be mounted slidably within the groove of the first block such that the leaf spring contacts the electrical contact thereon. Moreover, appropriate lead wires are secured to the shank portion thereof in the apertures of the second block creating an electrical connection therebetween.

BRIEF DESCRIPTION OF THE DRAWINGS

Other objects and advantages of the present invention will become apparent upon reading the following detailed description and upon reference to the drawings, in which.

While the present invention will be described in connection with a preferred embodiment thereof, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE INVENTION

Figure 1:
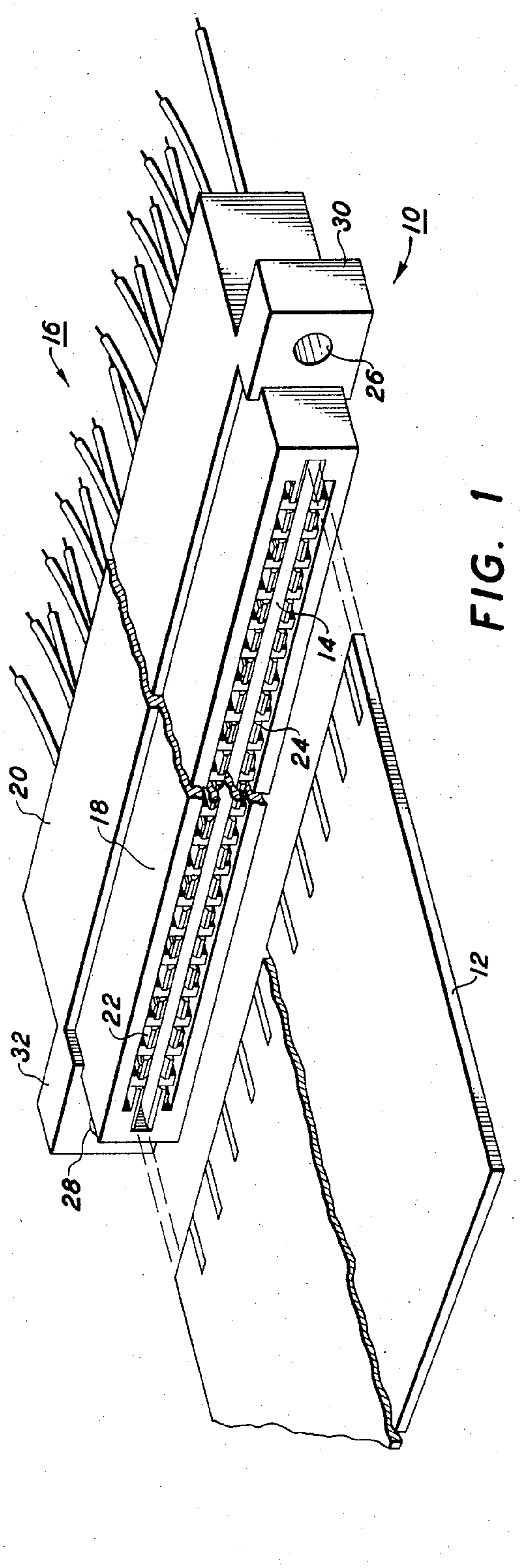
FIG. 1 is a perspective view of the electrical connector of the present invention.

With continued reference to the drawings, an embodiment of the present invention will hereinafter be described wherein like reference numerals have been used throughout to designate like elements. Referring now to FIG. 1, there is shown the electrical connector of the present invention designated generally by the reference numeral 10. The electrical connector is arranged to receive a multiple circuit board or printed circuit board 12 in groove 14 therein. A plurality of lead wires, depicted generally by the reference numeral 16, are shown, in FIG. 1, secured to connector 10. Electrical connector 10 includes a first elongated dielectric block 18 and a second elongated dielectric block 20 secured thereto. The foregoing dielectric blocks are preferably made from a suitable plastic, such as glass filled nylon, by, for example, a molding process. Block 18 has a pair of opposed rows of open ended compartments 22 and 24 respectively defining groove 14 therebetween. Each of the resilient electrical contacts are secured within dielectric block 18 and dielectric block 20. Electrical connector 10 may then be attached to any convenient support by means of suitable fasteners (not shown) which pass through openings 26 and 28 in respective flanges 30 and 32. Flanges 30 and 32 are integral with block 20 and depend therebeyond.

Figure 5:
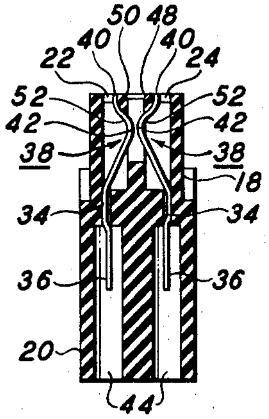
FIG. 5 is a sectional elevational view taken along the line 5—5 of FIG. 2 in the direction of the arrows.

Referring now to FIG. 5, there is shown in greater detail resilient electrical contact 34. As shown therein, resilient electrical contact 34 includes a shank portion 36 and a leaf spring portion depicted generally by the reference numeral 38. Leaf spring portion 38 includes a straight region 40 and an arcuate region 42. Each shank portion 36 extends into one of the apertures 44 in dielectric block 20.

Figure 4:
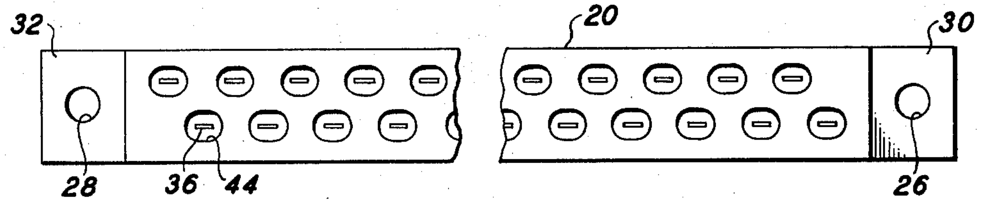
FIG. 4 is a bottom plan view of the electrical connector shown in FIG. 1.

Turning to FIG. 4 dielectric block 20 includes a pair of spaced, opposed rows of apertures 44. In each row, apertures 44 are staggered from one another (shown in FIG. 2) and extend through dielectric block 20. As shown in FIG. 5, shank 36 extends in a downwardly direction from the portion of resilient contact 34 secured in block 18 into each aperture 44 in block 20. Shank 36 is a flat member adapted to have a socket connector 46 (shown in FIG. 6) slidably mounted thereon. Socket connector 46 is adapted to interfit telescopically on shank portion 36. Leaf spring portion 38 of electrical contact 34 extends into alternate compartments of block 18.

Figure 2:
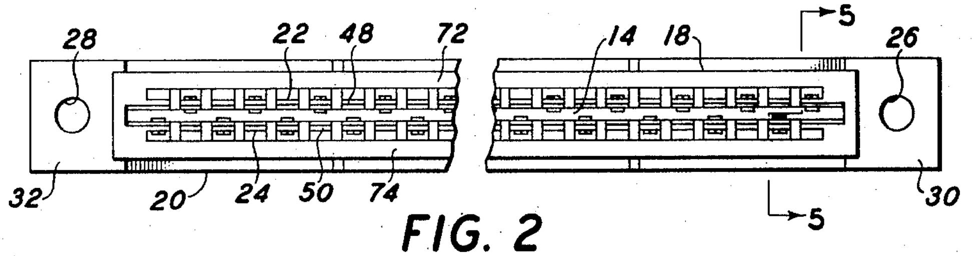
FIG. 2 is a top plan view of the FIG. 1 electrical connector.

Referring to FIG. 2, a pair of opposed spaced surfaces 48 and 50 function as interior walls of compartments 22 and 24 defining groove 14. Surfaces 48 and 50 are intermediate side walls 72 and 74. A plurality of apertures or slots 48 extend in a transverse direction to groove 14 through surfaces 48 and 50. One of the slots 48 passes from each compartment of rows 22 and 24 through the respective surfaces 48 and 50 to groove 14. Arcuate region 42 of contact 34 extends from each compartment through the appropriate slot 48 into groove 14. The foregoing is shown more clearly in FIG. 5. As illustrated in FIG. 5, electrical contact 34 is secured to block 20 with the leaf spring portion 38 having arcuate region 42 extending through slot 48 (FIG. 2) into groove 14 with straight region 40 in engagement with the interior side of surface 50. In this manner, contact 34 is attached to block 18. Alternate compartments within rows 22 and 24 have leaf spring portions 38 of the resilient contact 34 disposed therein. Each aperture 44 of block 20 has shank portion 36 of resilient contact 34 positioned therein. This is achieved by utilizing staggered rows of apertures 44 whereas the compartments of rows 22 and 24, respectively, are adjacent one another in opposed rows. It is, therefore, evident that in order to align contact 34 within appropriate apertures 44, leaf spring portion 38 must be positioned within alternate compartments rather than within adjacent compartments of rows 22 and 24.

Turning once again to FIG. 5, leaf spring 38 of electrical contact 34, preferably, is bifurcated. The resiliency of leaf spring 38 is determined by the size and shape of the cut out portion. Electrical contact 34, preferably, is made from a copper-nickel alloy with an optional gold plating thereon. Multiple circuit board 12 is adapted to be mounted slidably within groove 14, and is gripped therein by arcuate portion 42 of leaf spring 38. Preferably, leaf spring portion 38 grips multiple circuit board 12 with a force of about 50 grams.

Figure 3:
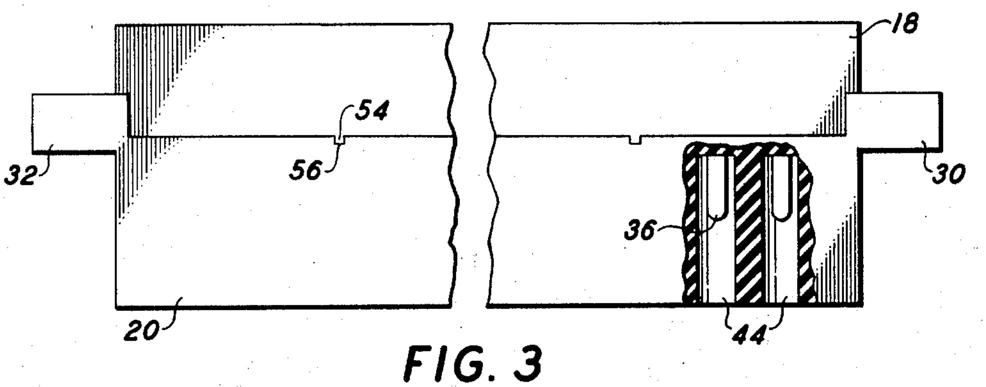
FIG. 3 is an elevational view of the FIG. 1 electrical connector.

Referring to FIG. 3, dielectric block 18 includes a pair of protuberances or keys 54. Dielectric block 20 has a corresponding pair of mating openings or notches 56 therein. Keys 54 are arranged to mate with notches 56 such that apertures 44 in block 20 are aligned with alternating compartments of rows 22 and 24, respectively, in block 18. It should be noted that the center to center distance between alternate compartments is preferably about 0.300 inches. This insures that international standards are met. Similarly, when socket 46 is mounted slidably on shank 36, it is recessed within block 20. In this way, Underwriters Laboratory standards are met without requiring additional protective devices. It is apparent that the construction and assembly of the foregoing connector is relatively inexpensive.

The connector may be assembled as follows. Resilient electrical contacts are secured within dielectric block 18 by positioning the arcuate region 44 of leaf spring portion 38 within alternate compartments of the respective rows 22 and 24. Arcuate region 42 extends through slots 52 of the respective surfaces 48 and 50 into groove 14, and is, thereby affixed thereto. The composite assembly of block 18 and contact 34 has shank portion 36 extending therefrom. This subcomponent is then mated with dielectric block 20. Prior to joining block 18 with block 20, shank portion 20 of contact 34 extends from alternate compartments of respective rows 22 and 24 within elongated block 18. In this way, shank portion 36 is inserted into each aperture 44 of block 20.

While the invention has been described in connection with the foregoing method of assembly, one skilled in the art will appreciate that the invention is not necessarily so limited and that various other methods of assembly may be utilized without departing from the spirit of the present invention.

Figure 6:
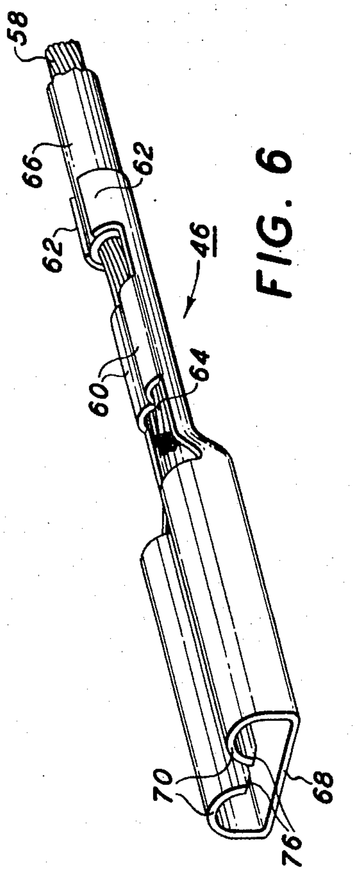
FIG. 6 is a perspective view of a lead wire socket adapted to be interconnected with the FiG. 1 electrical connector.

Turning now to FIG. 6, there is shown socket 46 in detail. Socket 46 is attached by suitable means to external lead wire 58. Generally, socket 46, as shown in FIG. 6, includes a pair of ears 60 and 62 which are crimped to attach the stripped metallic core 64 and insulation 66, respectively, of lead wire 58 thereto. Socket 46 includes a base 68 having a pair of opposed side flanges 70 bent back over the base towards one another with the edges 76 thereof spaced less than the width of shank 36. Side flanges 70, additionally, are curved having a radius of curvature slightly larger than the thickness of shank 36. As constructed, socket 46 may be mounted slidably on shank 36 to interfit telescopically thereon. Socket 46 may be made, preferably, for a metal, e.g., phosphur bronze with a highly conductive and corrosive-resistant coating such as tin plating.

In using connector 10, it is merely necessary to mount circuit board 12 slidably in groove 14. When circuit board 12 is disposed within groove 14, arcuate portions 42 of resilient contacts 34 engage the end contacts of the respective circuit elements disposed thereon. Circuit board 12 is electrically connected to the lead wires 58 by slidably mounting socket 46 on shank 36. Socket 46 is interfit telescopically over shank 36 within aperture 44 of dielectric block 20. In this manner, circuit board 12 is electrically connected to lead wires 58.

In recapitulation, it is apparent that the electrical connector of the present invention achieves the appropriate safety standards established by the Underwriters Laboratory by recessing the lead wire socket within the dielectric connector. In addition thereto, the spacing between electrical contacts connecting the circuit board to the lead wires is such that international requirements are maintained in a relatively simple fashion, i.e., by utilizing alternate compartments rather than adjacent compartments for housing the contacts. Moreover, the present connector is relatively simple to manufacture and easy to fabricate inasmuch as it is made from a plastic which is readily moldable. It is, therefore, evident that the present invention is a relatively simple electrical connector easily fabricated and relatively simple to use while still meeting appropriate safety standards.

Thus, it is apparent that there has been provided, in accordance with the present invention, an electrical connector that fully satisfies the objects, aims and advantages set forth above. While the invention has been described in conjunction with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. An electrical connector for interconnecting a multiple circuit board with a plurality of lead wires, including:

a first elongated dielectric block having at least a pair of opposed space rows of open ended compartments defining a groove therebetween extending substantially along the longitudinal axis thereof from one end wall and terminating at the other end wall spaced therefrom; compartments on one side of said groove being paired with compartments on the other side of said groove such that pairs of compartments lie along lines normal to said longitudinal axis;

a second elongated dielectric block having at least a pair of rows of apertures with said apertures being staggered in one row from the other, said second elongated dielectric block being secured to said first elongated dielectric block with the apertures in said second elongated dielectric block aligned with one of said pair compartments in said first elongated dielectric block, the other of said paired compartments being closed off by said second dielectric block; and a plurality of resilient electrical contacts, each of said contacts having a shank portion extending into one of the apertures in said second elongated dielectric block and a leaf spring portion having an arcuate region and a straight region, said straight region of the leaf spring portion of each of said resilient electrical contacts extending into said one of said paired compartments of said first elongated dielectric connector with the center to center distance between adjacent shank portions on the same side of said groove being about 0.300 inches, the arcuate region of the leaf spring portion being arranged to extend into the groove of said first elongated dielectric block to electrically connect the multiple circuit board in the groove of said first elongated dielectric block with lead wires secured to the shank portion of said resilient contact.

2. A connector as recited in claim 1, wherein said first elongated dielectric block includes a pair of spaced opposed surfaces intermediate the side walls thereof to define the groove therein, said surfaces have a plurality of slots substantially transverse to the groove and extending from the groove into each compartment permitting the arcuate region of the leaf spring portion of said resilient contact to extend into the groove.

3. A connector as recited in claim 2, wherein the leaf spring portion of said resilient electrical contact is bifurcated.

4. A connector as recited in claim 3, having the multiple circuit board disposed in the groove of said first elongated dielectric block wherein the arcuate region of the leaf spring portion of said resilient contact engages the multiple circuit board forming an electrical connection therewith and gripping the multiple circuit board with a force, preferably, of about 50 grams.

5. A connector as recited in claim 4, further including electrical sockets mounted slidably on the shank portion of said resilient contacts to interfit telescopically therewith, said sockets being recessed within said second elongated dielectric block.

6. A connector as recited in claim 1, wherein said second elongated dielectric block includes spaced elongated flanges depending beyond the end walls thereof.

7. A connector as recited in claim 1, wherein said first elongated dielectric block and said second elongated dielectric block are made preferably from a plastic material.

* * * * *